(12) United States Patent
Aktas et al.

(10) Patent No.: US 8,911,834 B2
(45) Date of Patent: Dec. 16, 2014

(54) OXIDE COMPOUNDS AS A COATING COMPOSITION

(75) Inventors: Oral Cenk Aktas, Saarbruecken (DE); Michael Veith, St.-Ingbert (DE); Sener Albayrak, Saarbruecken (DE); Benny Siegert, Mulhouse (FR); Yann Patrick Wolf, Saarbruecken (DE)

(73) Assignee: Leibniz-Institut fuer Neue Materialien gemeinnuetzige GmbH, Saarbruecken (DE)

( * ) Notice: Subject to any disclaimer, the term of this patent is extended or adjusted under 35 U.S.C. 154(b) by 1079 days.

(21) Appl. No.: 12/741,219

(22) PCT Filed: Nov. 4, 2008

(86) PCT No.: PCT/EP2008/009287
§ 371 (c)(1),
(2), (4) Date: Oct. 6, 2010

(87) PCT Pub. No.: WO2009/059740
PCT Pub. Date: May 14, 2009

(65) Prior Publication Data
US 2011/0017659 A1   Jan. 27, 2011

(30) Foreign Application Priority Data
Nov. 5, 2007 (DE) .......................... 10 2007 053 023

(51) Int. Cl.
| | | |
|---|---|---|
| *B05D 3/00* | (2006.01) | |
| *B05D 3/06* | (2006.01) | |
| *C01F 7/02* | (2006.01) | |
| *C23C 16/40* | (2006.01) | |
| *C23C 16/56* | (2006.01) | |
| *C23C 26/00* | (2006.01) | |

(52) U.S. Cl.
CPC ............... *C23C 16/403* (2013.01); *C23C 16/56* (2013.01); *C23C 26/00* (2013.01)
USPC ........................... 427/554; 427/596; 423/630

(58) Field of Classification Search
None
See application file for complete search history.

(56) References Cited

U.S. PATENT DOCUMENTS

| | | |
|---|---|---|
| 5,302,368 A | 4/1994 | Harato et al. |
| 5,489,639 A * | 2/1996 | Faber et al. .................... 524/417 |

(Continued)

FOREIGN PATENT DOCUMENTS

| | | |
|---|---|---|
| DE | 195 29 241 A1 | 2/1997 |
| DE | 195290241 A1 | 2/1997 |

(Continued)

OTHER PUBLICATIONS

Todd et al., "Manufacturing Processes Reference Guide", Industrial Press Inc., 1994, p. 188.*

(Continued)

*Primary Examiner* — Timothy Meeks
*Assistant Examiner* — Ina Agaj
(74) *Attorney, Agent, or Firm* — Cahn & Samuels, LLP

(57) ABSTRACT

The invention relates to a coating composition consisting of an oxide compound. The invention also relates to a method for producing a coating composition consisting of an oxide compound and to a method for coating substrates composed of metal, semiconductor, alloy, ceramic, quartz, glass or glass-type materials with coating compositions of this type. The invention further relates to the use of a coating composition according to the invention for coating metal, semiconductor, alloy, ceramic, quartz, glass and/or glass-type substrates.

14 Claims, 9 Drawing Sheets

(56) References Cited

U.S. PATENT DOCUMENTS

| | | | |
|---|---|---|---|
| 5,654,035 | A | 8/1997 | Ljungberg et al. |
| 5,683,761 | A | 11/1997 | Bruce et al. |
| 6,007,764 | A | 12/1999 | Benda et al. |
| 6,048,954 | A | 4/2000 | Barlow et al. |
| 6,187,390 | B1 * | 2/2001 | Seeger et al. ............ 427/555 |
| 6,521,203 | B1 | 2/2003 | Mohri et al. |
| 6,713,172 | B2 | 3/2004 | Ljungberg et al. |
| 7,238,420 | B2 | 7/2007 | Lee et al. |
| 7,420,156 | B2 | 9/2008 | Kim et al. |
| 7,603,003 | B2 | 10/2009 | Bureatea et al. |
| 8,197,889 | B2 | 6/2012 | Petersen et al. |
| 2005/0038498 | A1 | 2/2005 | Dubrow et al. |
| 2006/0046100 | A1 | 3/2006 | Hessman |
| 2009/0233349 | A1 | 9/2009 | Petersen et al. |
| 2009/0266356 | A1 | 10/2009 | Liu et al. |
| 2009/0317766 | A1 | 12/2009 | Heidenau et al. |
| 2010/0218854 | A1 | 9/2010 | Saban et al. |
| 2011/0017659 | A1 | 1/2011 | Aktas et al. |
| 2012/0128932 | A1 | 5/2012 | Veith et al. |
| 2013/0101836 | A1 | 4/2013 | Aktas et al. |

FOREIGN PATENT DOCUMENTS

| | | |
|---|---|---|
| DE | 102007053023 A | 5/2007 |
| DE | 10 2006 013484 A1 | 9/2007 |
| DE | 102006013484 A1 | 9/2007 |
| DE | 102006041023 A1 | 3/2008 |
| DE | 10 2007 053023 A1 | 5/2009 |
| EP | 1 616 977 A | 1/2006 |
| EP | 1679088 A | 7/2006 |
| WO | WO 93/19686 A | 10/1993 |
| WO | WO 98/26937 A | 6/1998 |
| WO | 0203894 A | 1/2002 |
| WO | 2006118595 A | 11/2006 |
| WO | WO 2007/102143 A | 9/2007 |
| WO | 2008011920 A1 | 1/2008 |
| WO | 2009034197 A1 | 3/2009 |
| WO | 2009091384 A1 | 7/2009 |
| WO | 2010022107 A2 | 2/2010 |

OTHER PUBLICATIONS

Veith, et al., "Perodical Micro-Structuring of Hydride Containing Metastable Aluminumoxide using Laser Interference Metallurgy", Advanced Engineering Materials, 2005, No. 1-2, p. 27-29.*

Veith, Michael, et al., "(tert-Butoxy) aluminium and -gallium Hydrides," Chem. Ber., 1996, pp. 381-384, vol. 129.

English translation of International Preliminary Report on Patentability.

Veith M, et al., "Preparation of a thin film of Al/Al2O3 using a single source precursor," Journal of Metastable and Nanocrystalline Materials, Proceedings of the 9th International Symposium on Metastable Mechanically Alloyed and Nancrystalline Materials, Bd. 15-16, Sep. 2002, pp. 279-82.

Veith M, et al., "The Metastable, Glasslike Solid-State Phase of HAlO and Its Transformation to Al/Al2O3 Using a CO2 Laser," European Journal of Inorganic Chemistry, Nr. 24, 22, Oct. 2003, pp. 4387-4393.

Mathur S, et al., "Single-Step Preparation of Nanocomposites," Materials Science Forum, Bd. 386-388, Jan. 2002, pp. 341-346.

Pradhan, et al.,"Crystallinity of Al2O3 films deposited by metalorganic chemical vapour deposition," Surface and Coating Technology, 176, 2004, p. 382-384.

Triantafyllids, et al., "Surface Treatment of Alumina-Based Ceramics Using Combined Laser Sources," Applied Surface Science, 186, 2002, p. 140-144.

Zheng, et al., "Effect of Core-Shell Composite Particles on the Sintering Behaviour and Properties of Nano-Al2O3/ polystyrene Composite Prepared by SLS," Materials Letters, 60, 2006, p. 1219-1223.

English Abstract of EP 1 616 977, Published Jan. 18, 2006.

English Abstract of WO 98/26937.

Webster, Thomas J., et al., "Increased Osteoblast Functions on Theta + Delta Nanofiber Alumina," Biomaterials, 2005, 953-60, vol. 26.

Hulbert, S. F., et al., "Potential of Ceramic Materials as Permanently Implantable Skeletal Prostheses," J. Biomed. Mater. Res., 1970, pp. 433-456, vol. 4.

Jaeger, M., et al., "Significance of Nano- and Microtopography for Cell-Surface Interactions in Orthopaedic Implants," Journal of Biomedicine and Biotechnology, 2007, vol. 2007.

Swan, Erin E., et al., Fabrication and Evalution of Nanoporous Alumina Membranes of Osteoblast Culture, Jan. 14, 2005, www.interscience.wiley.com.

Veith M., et al., "Synthesis and Microstructure of Nanostructured Al/Al2O3 (H)-composite," Journal of Materials Science, 1996, vol. 31, 2009-17.

Veith M., et al., "New Metal-Ceramic Composites Grown by Metalorganic Chemical Vapour Deposition," 1994, vol. 13, 335-37.

Veith, Michael, et al., "The Transformation of Core/Shell Aluminium/Alumina Nanoparticles into Nanowires," Eur. J. Inorg. Chem., 2008, 5181-84.

* cited by examiner

Energy

OXIDE COMPOUNDS AS A COATING COMPOSITION

This patent application is a U.S. national stage application of PCT international application PCT/EP2008/009287 filed on Nov. 4, 2008 which claims priority of German patent document 10 2007 053 023.6-43 filed on Nov. 5, 2007.

FIELD OF THE INVENTION

The present invention relates to a coating composition consisting of oxide compounds, to a method for producing said oxide compounds, and to the use thereof.

BACKGROUND OF THE INVENTION

Oxide layers, in particular ceramic and especially aluminum oxide ($Al_2O_3$), are used as coating material for a multiplicity of applications which impose stringent demands in respect of heat stability and heat shock stability or resistance to wear, oxidation or hot corrosion, thermal stability and electrical insulation.

Such layers can act as a diffusion barrier for ions and have high chemical stability and radiation resistance. They are therefore used in many fields. Thus, by way of example, aluminum oxide serves as an insulation material in the field of microelectronics. Owing to its chemical resistance and biocompatibility, it is also used in the field of medicine. Coatings comprising oxides are a good option for protecting surfaces against oxidation or hot corrosion, for example. This high chemical stability coupled with highly advantageous mechanical properties make oxides an ideal material for protective layers.

In this case, the production of suitable oxide compounds constitutes a major challenge; particularly the production of suitable oxide compounds having high homogeneity and purity is difficult. Thus, by way of example, aluminum oxide is present either as an amorphous phase or in various crystalline modifications with different properties. Said modifications have the more advantageous properties for protective coatings, since amorphous phases are normally softer. Crystalline aluminum oxide can be present in various modifications, of which only $\alpha$-$Al_2O_3$ (corundum) is thermodynamically stable. The others, so-called transition aluminum oxides, such as $\gamma$, $\delta$, $\eta$, $\theta$, $\chi$, $\chi'$-$Al_2O_3$ and $Al_2O_3$-KII, are metastable and can be irreversibly converted into $\alpha$-$Al_2O_3$. Above 1200° C., corundum is the only stable modification. In this case, corundum is also the hardest modification of aluminum oxide. The low ionic conductivity and its high thermodynamic stability make it an important coating against oxidations.

The prior art discloses a variety of methods for producing coatings and films composed of aluminum oxide, such as, for example, chemical vapor deposition (CVD), physical vapor deposition (PVD), hydrothermal synthesis, sputtering or the sol-gel method.

U.S. Pat. No. 6,521,203 describes the production of $\alpha$-$Al_2O_3$ by calcination of aluminum hydroxide, produced by hydrolysis of aluminum isopropoxide, at a temperature of 700 to 1300° C. However, this method does not permit the production of thin coatings.

U.S. Pat. No. 5,302,368 describes the production of coatings by applying a dispersion of aluminum hydroxide and/or a transition aluminum oxide in aqueous medium. After adjusting the slurry and spray drying, the dry powder is calcined in the presence of a chlorine-containing substance at 1100° C. to 1500° C.

For industrial applications for depositing oxide layers, chemical vapor deposition (CVD) at high temperatures, normally around 1000° C., is normally used since this technique affords the possibility of coating even complex geometries in conjunction with well-controllable thickness of the coating.

U.S. Pat. No. 5,654,035 describes such a process wherein the body to be coated is brought into contact at high temperature with a hydrogen carrier gas and a hydrolyzing or oxidizing agent, said hydrogen carrier gas containing one or more aluminum halides. In addition, U.S. Pat. No. 6,713,172 describes the application of this method for coating cutting tools, once again at high temperatures of approximately 1000° C.

U.S. Pat. No. 7,238,420 describes a nanotemplate composed of relatively pure and fully crystalline $\alpha$-$Al_2O_3$ on a metal alloy. In the production method disclosed, crystalline $\alpha$-$Al_2O_3$ is produced with the aid of CVD directly on the surface of the alloy. For this purpose, the latter is pretreated before the deposition with a $CO_2/H_2$ mixture at high temperatures of 1000° C. to 1200° C.

All the methods described require high temperatures. The latter not only limit the possible substrates but can also lead to thermal flaws in the coating. Thus, the oxide coatings and the substrate often have different coefficients of thermal expansion of film and substrate, which leads to thermally induced flaws in the coating.

In order to avoid the high temperatures, major efforts have been undertaken to develop methods which make it possible to deposit oxide layers at lower temperatures, for example physical vapor deposition (PVD).

U.S. Pat. No. 5,683,761 describes a method for depositing $\alpha$-$Al_2O_3$ with the aid of electron beam PVD. However, the substrate has to be heated to approximately 1000° C. Therefore, the deposition of pure oxide, in this case $\alpha$-$Al_2O_3$, also requires high temperatures.

Variants of the CVD method, such as plasma assisted/enhanced chemical vapor deposition (PACVD/PECVD) or metal organic chemical vapor deposition (MOCVD) likewise afford the possibility of using lower temperatures.

Thus, Pradhan et al. (Surf. Coat. Tech. 176 (2004) 382-384) describes that the use of metallo-organic aluminum compounds leads to the formation of crystalline aluminum oxide at low temperatures (higher than 550° C.). Only amorphous films were obtained at lower temperatures.

Although MOCVD methods afford many advantages, such as, for example, lower temperatures, simple processes, uniform coatings or the use of a single precursor, they also lead to carbon-like impurities in the coating.

The degree of crystallinity and the crystalline phases within the deposited oxide layer are very important for the mechanical properties thereof. A pure phase having high thermal and mechanical stability is distinctly preferred to a mixture of different phases. However, this necessitates a suitable heat treatment of the coated substrate which leads not only to the transformation into the desired phase but additionally to a densification of the coating, which is likewise of great importance for the mechanical stability of the layer. Such a heat treatment often requires temperatures of greater than 1200° C., which are not suitable for many substrates.

In order to avoid the heating of the entire coated substrate, a local heat treatment is appropriate. In this context, lasers have already been used successfully for the treatment of such ceramic materials (laser sintering). In this case, the coating is heated in a small region with the aid of a laser beam. These methods are used precisely in the field of oxide ceramics since they absorb in the range of the $CO_2$ lasers used. In this case, one particular problem is the formation of thermally induced flaws during the resolidification and cooling of the material.

They result from the brittleness of the ceramics and from the high temperature gradient between the region of action and the surrounding material, and also the different coefficients of thermal expansion of coating and substrate.

Thus, Triantafyllids et al. (Appl. Surf, Sci. 186 (2002) 140-144) and WO 2007/102143 describe the occurrence of thermally induced cracks during laser sintering. Such defects naturally influence the density and stability of the coating and the homogeneity of the phase transformation.

These effects can be reduced by adding binders to the oxide compounds, e.g. the aluminum oxide particles. Thus, U.S. Pat. No. 6,048,954 describes such a binder composition for inorganic particles having a high melting point. Although such binders increase the densification of the coating, they can only be employed for pulverulent materials and the binder and also the residues thereof have to be removed after the laser sintering or even remain in the oxide layer.

Since the efficiency of laser sintering is highly dependent on the absorption of the material to be sintered, absorption is an important criterion. In this case, the binder can also contribute to the absorption. Thus, U.S. Pat. No. 6,007,764 describes the use of a mixture of absorbent and ceramic particles in order to improve the absorption. Zheng et al. (Mat. Lett. 60 (2006) 1219-1223) use polystyrene-coated aluminum oxide particles in order to optimize the absorption for $CO_2$ lasers. Said particles exhibited better absorption and therefore also more uniform heating and a reduced temperature gradient. However, organic material always remains as a residue in the coating.

DE 10 2006 013 484 A1 describes the production of an element/element oxide composite material, that is to say a material containing an element and the corresponding element oxide, in this case nanowires comprising a metal core and an oxide sheath.

The disadvantage of most methods for producing oxide layers resides in the high temperatures of the method. In the case of the laser sintering methods, the essential disadvantages are that only very specific lasers in a certain wavelength range, usually $CO_2$ lasers, are suitable for being used; the precursors used do not absorb other wavelengths. This causes high temperature gradients and leads to a higher loading of the substrate and to thermally induced cracks and defects. Therefore, the addition of additional binders is often necessary in order to increase the absorption of the laser energy and to achieve a high quality of the coating. However, residues of said binders remain in the coating. Moreover, the production of high-quality and fault-free coatings requires a high degree of experience since influencing of the underlying substrate or excessive heating has to be avoided.

Problem

The present invention addresses the problem of overcoming the disadvantages of the prior art in the production of oxide layers as a coating composition. The problem addressed by the invention is, in particular, that of specifying a method which makes it possible to produce suitable oxide compounds as a coating composition.

SUMMARY OF INVENTION

This problem is solved by the invention with the features of the independent claims. Advantageous developments of the inventions are characterized in the dependent claims. The wording of all the claims is hereby incorporated by reference in the content of this description. The invention also encompasses all expedient and in particular mentioned combinations of independent and/or dependent claims.

Individual method steps are described in greater detail below. The steps need not necessarily be carried out in the order indicated, and the method to be portrayed can also have further steps that are not mentioned.

In order to solve the stated problem, a method for producing oxide layers is proposed, which comprises the following method steps:
 a) application of an element/element oxide composite structure on the substrate
 b) (brief) local heating of the element/element oxide composite structure, preferably by means of a laser.

The method according to the invention surprisingly yields oxide layers which have few to no defects and high hardness and densification. The composite structure is designated as a composite structure since it consists both of the element and of the element oxide.

The coating according to the invention of the surface with the element/element oxide composite structure is preferably carried out according to the metal organic chemical vapor deposition (MOCVD) method. In this method, metallo-organic precursors are converted into the vapor phase and thermolytically decomposed, the nonvolatile decomposition product generally depositing at or on the substrate. The precursors used in the invention have the general formula $$El(OR)_nH_2$$

wherein El denotes Al, Ga, In, Tl, Si, Ge, Sn, Pb or Zr, and R represents an aliphatic or alicyclic hydrocarbon radical, and n has the value 1 or 2.

The aliphatic and alicyclic hydrocarbon radical is preferably saturated and has, for example, a length of 1 to 20 carbon atoms. Alkyl or unsubstituted or alkyl-substituted cycloalkyl are preferred. The alkyl radical preferably has 2 to 15 carbon atoms, preferably 3 to 10 carbon atoms, and can be linear or branched, where branched alkyl radicals are preferred. Examples that may be mentioned here include: ethyl, n-propyl, n-butyl and the corresponding higher linear homologs, isopropyl, sec-butyl, neopentyl, neohexyl and the corresponding higher isoalkyl and neoalkyl homologs or 2-ethylhexyl. The alicyclic rings can comprise 1, 2 or more rings, each of which can be substituted by alkyl. The alicyclic radical preferably comprises 5 to 10, particularly preferably 5 to 8, carbon atoms. Examples that may be mentioned here include: cyclopentyl, cyclohexyl, methylcyclohexyl, norbornyl and adamantyl.

Oxide compounds which form ceramic oxides are preferably used according to the invention.

Particular preference is given to aluminum alkoxydihydrides having branched alkoxy radicals having 4 to 8 carbon atoms, in particular aluminum tert-butoxydihydride. The production of such compounds is described in DE 19529241. They can be obtained for example by reacting aluminum hydride with the corresponding alcohol in a molar ratio of 1:1, wherein the aluminum hydride can be prepared in situ by reacting an alkali metal aluminum hydride with an aluminum halide. Furthermore, the production of such compounds is also described by Veith et al. (Chem. Ber. 1996, 129, 381-384), where it is also shown that the compounds of the formula $El(OR)H_2$ can also comprise dimeric forms.

The compounds are preferably converted into the vapor phase and thermolytically decomposed, the nonvolatile decomposition product generally being formed at or on a substrate in the form of the element/element oxide composite structure. Appropriate substrates for applying the coating include all customary materials, for example metal, ceramic, alloys, quartz, glass or glass-like materials, which are preferably inert with respect to the starting and end products. The thermolysis can be carried out e.g. in a furnace, at an inductively heated surface or at a surface situated on an inductively heated sample carrier. Only conductive substrates such as, for example, metals, alloy or graphite can be used in the case of inductive heating. In the case of substrates having a low conductivity, an electrically conductive substrate carrier or furnace should be used in the case of inductive heating. The substrate can therefore be either a surface of the reaction space or a substrate positioned therein. The reactor space used can have any desired configuration and consist of any customary inert material, for example Duran or quartz glass. Reactor spaces having hot or cold walls can be used. The heating can be effected electrically or by other means, preferably with the aid of a radiofrequency generator. The furnace and also the substrate carrier can have any desired forms and sizes corresponding to the type and form of the substrate to be coated; thus, the substrate can be for example a plate, plane surface, tubular, cylindrical, parallelepipedal or have a more complex form.

It may be advantageous to purge the reactor space a number of times with an inert gas, preferably nitrogen or argon, before the precursor is introduced. Moreover, it may be advantageous to apply an interim vacuum, if appropriate, in order to render the reactor space inert.

Furthermore, it may be advantageous, before the metallo-organic precursor is introduced, to heat the substrate to be coated, for example metal, alloy, semiconductor, ceramic, quartz, glass or glass-like, to above 500° C. in order to clean the surface.

The desired element/element oxide composite structure preferably arises at temperatures of more than 400° C., particularly preferably more than 450° C. Preference is given to temperatures of not more than 1200° C., in particular not more than 600° C., e.g. from 400° C. to 1200° C., and preferably from 450° C. to 650° C., especially preferably 450° C. to 600° C. The substrate on or at which the thermolysis takes place is accordingly heated to the desired temperature. In this case, the production of the element/element oxide composite structure according to the invention is independent of the substrate material used and the constitution thereof.

The (metallo-organic) compound or the precursor can be introduced into the reactor from a supply vessel, which is preferably temperature-regulated to a desired evaporation temperature. Thus, it can be temperature-regulated for example to a temperature of between −50° C. and 120° C., preferably between −10° C. and 40° C. The thermolysis in the reactor space is generally effected at a reduced pressure of $10^{-6}$ mbar to atmospheric pressure, preferably in a range of $10^{-4}$ mbar to $10^{-1}$ mbar, preferably $10^{-4}$ mbar to $10^{-2}$ mbar. In order to generate the vacuum, a vacuum pump system can be connected to the reactor on the outlet side. All customary vacuum pumps can be used; a combination of rotary vane pump and turbomolecular pump or a rotary vane pump is preferred. It is expedient for the supply vessel for the precursor to be fitted on the side of the reactor space and the vacuum pump system on the other side.

When the substrate is heated by induction, e.g. electrically conductive metal laminae or films having a size measured in square centimeters can be arranged as substrate in a reaction tube composed of Duran or quartz glass. Upon adaptation of the dimensions of the apparatus, substrate areas in the range from square decimeters through to several square meters are likewise possible. The supply vessel with the precursor, temperature-regulated to the desired evaporation temperature, is connected to the reaction tube on the inlet side and a vacuum pump system is connected to said reaction tube on the outlet side. The reaction tube is situated in a radiofrequency induction field that is used to heat the substrate laminae or films to the desired temperature. After the desired pressure has been set and a precursor has been introduced, the substrate is covered with the element/element oxide composite structure.

It is advantageous to regulate the flow rate of the precursor using a valve. The valve can be controlled manually or automatically. Depending on the desired thickness of the coating, the duration of the addition of the precursor can be from a few minutes up to several hours.

The morphology of the element/element oxide composite structure can be controlled by varying one or more process parameters selected from substrate temperature, gas pressure, precursor feed temperature, precursor flow (amount of precursor introduced per unit time) and vapor deposition time.

In a further development, the element/element oxide composite structure obtained can be subjected to a treatment with a mixture, a solution and/or a suspension of organic and/or inorganic substances.

In a further configuration of the invention, the substrate can be coated with the element/element oxide composite structure only in desired regions, which also restricts the treatment by local heating to said regions.

After cooling, the element/element oxide composite structure is locally heated, particularly preferably with the aid of a laser. This process is also referred to as sintering. In this case, the element/element oxide composite structure is converted into the desired element oxide structure. This alteration can also comprise conversion into one or more modifications of a crystal structure; the formation of a single modification of the element oxide is particularly preferred in this case.

As a particular advantage of the invention, the element/element oxide composite structure has a better thermal conductivity than the pure element oxide and, as a result, leads to a reduced temperature gradient during the local heating. This reduces the cracks induced thereby.

In one advantageous development of the invention, the elemental component of the element/element oxide composite structure can function as a binder by virtue of the fact that it melts during heating and can thus fill cracks and pores that have possibly arisen in the element/element oxide composite structure as a result of the heating. As a result, it is not necessary to add a separate binder, which might lead to undesired residues.

In one advantageous development of the invention, the element/element oxide composite structure is not completely converted into the corresponding element oxide at the heating location. The degree of conversion can be controlled very accurately by control of the laser intensity and the duration of action. This makes it possible to selectively produce regions having a specific structure and morphology, and thus for example to produce nanowires, nanoparticles and fractal surfaces.

In a further advantageous development of the invention, the element/element oxide composite structure is completely converted into the corresponding element oxide at the heating location. The degree of conversion can be controlled up to complete conversion by control of the laser intensity and the duration of action. By melting the metallic component of the element/element oxide composite structure, it is possible to produce particularly defect-free and uniform oxide layers.

A further major advantage of the present invention is the possibility of being able to choose the wavelength of the laser from a large wavelength range. The element/element oxide composite structure produced can be a broadband absorber and thus absorb light from a very broad wavelength range. The wavelength of the laser can lie in the range from UV to electromagnetic waves, preferably in the range of 300 nm to 15 µm, particularly preferably in the range of 500 nm to 11 µm, even more advantageously, but without restriction to lasers having the wavelengths of 488 nm, 514 nm, 532 nm, 635 nm, 1064 nm or 10.6 µm. Continuous (CW) or pulsed lasers can be used.

Preferably, the laser energy used, depending on the wavelength used and the element/element oxide composite structure, is between 1 milliwatt per square centimeter and a number of watts per square centimeter, preferably between 1 milliwatt per square centimeter and 10 watts per square centimeter, particularly preferably between 1 mW/cm$^2$ and 5 W/cm$^2$.

One particular advantage of the invention is the realization of very small penetration depths of the laser. Thus, the penetration depth, with the use of a pulsed laser, for example, can be reduced to a range of less than approximately 400 nm, preferably less than approximately 300 nm, particularly preferably less than approximately 200 nm, especially preferably less than approximately 100 nm. This enables not only the production of very thin layers, but also particularly mild treatment of the substrate. The layer thickness of the element oxide layer produced can accordingly lie between approximately 400 nm and approximately 10 nm, preferably between approximately 300 nm and approximately 10 nm, particularly preferably between approximately 200 nm and approximately 10 nm, especially preferably between approximately 100 nm and approximately 10 nm. Theoretically, it would even be possible to produce just a few monolayers of element oxide, that is to say just a few layers of atoms. Furthermore, the small penetration depth protects a temperature-sensitive substrate against thermal energy input and, in addition, mechanical stresses at the interface between coating and substrate are avoided. Thus, it is also possible to use substrates which themselves absorb the laser wavelength used. Moreover, it is also possible to convert only the surface of an element/element oxide composite structure having a relatively large layer thickness.

A further particular advantage of the invention resides in the possibility of being able to produce not only particularly thin but also particularly hard oxide layers, which particularly preferably afford a high degree of protection against corrosion as a result of low permeability.

A further advantageous development of the invention involves measuring the light absorption of the element/element oxide composite structure at the treatment location, during the heating or between a plurality of sintering processes. As a result of the conversion of the element/element oxide composite structure into the desired element oxide, it is possible to alter the absorption for example of light in the visible range, at the heating location. From this alteration, it is possible to produce a specific degree of conversion by adapting method parameters such as, for example, but without restriction to, laser intensity, wavelength, time of action of the laser, repetitions of the heating. After the desired degree has been achieved, the heating can be ended at this location.

In a particularly advantageous configuration of the invention, the wavelength of the laser is chosen in such a way that it is reflected by a pure element oxide layer. As a result, after complete conversion of the element/element oxide composite structure has been effected, at the heating location, no further absorption of the laser light takes place since the element oxide then present does not absorb said light. As a result, the conversion can be stopped "automatically" upon the pure element oxide being attained, since no further heating by the laser occurs. An "overheating" of the element oxide layer, which can lead to defective positioning, for example as a result of the formation of granulation, in the element oxide layer, is avoided as a result.

Moreover, the substrate lying below the layer can be treated mildly in this way. At the same time, this development permits the use of higher laser intensities than were possible in conventional methods with the same layer thickness and substrate.

Lasers having wavelengths in the visible range of light are particularly preferably chosen for this configuration of the present invention. The local heating using lasers having this wavelength range is possible by virtue of the absorption properties of the element/element oxide composite structure according to the invention.

As an alternative, the "overheating" of the oxide layer produced can also be used to set a specific porosity as a result of the targeted production of defects.

A further advantage of the present invention resides in the possibility of carrying out the heating locally, that is to say not only with mild treatment of the underlying substrate but also just in desired regions of the element/element oxide composite structure, if, by way of example, such a coating is desired only on the outer side of the substrate. On the other hand, it is likewise possible to treat the entire surface of the substrate, particularly preferably by line-by-line scanning with the aid of a computer-controlled laser scanner.

A further advantage of the present invention resides in the possibility of producing a specific desired structure on the surface of the substrate by targeted proportional or complete conversion of the element/element oxide composite structure. The possibility of using lasers having shorter wavelengths enables structures having a significantly higher resolution than with the $CO_2$ lasers used heretofore, theoretically limited by half of the wavelength used.

Furthermore, the local heating according to the invention can be carried out with the aid of a computer-controlled laser scanner, preferably with a focusing optical unit in order to focus the laser beam better.

The present invention furthermore relates to a coating composition, in particular producible by the abovementioned method according to the invention, comprising oxide layers having a high to complete oxide proportion, which are produced by thermolytic decomposition of metallo-organic compounds of the formula $El(OR)_nH_2$, wherein El denotes Al, Ga, In, Tl, Si, Ge, Sn, Pb or Zr, and R represents an aliphatic or alicyclic hydrocarbon radical, and n has the value 1 or 2, at a temperature of more than 400° C. with the formation of an element/element oxide composite structure, and the element/element oxide composite structure produced is converted into the oxide compound by brief local heating, preferably by means of a laser (sintering).

Preferably, the proportion of the oxide compound in the coating composition is at least 80%, preferably at least 95%, particularly preferably almost 100%.

Preferably, the oxide compound is a ceramic oxide, and aluminum or gallium oxide is particularly preferred, especially preferably aluminum oxide and most preferably aluminum oxide as $\alpha\text{-}Al_2O_3$ (corundum).

According to the invention, the coating composition can have a high hardness; by way of example, a hardness of approximately 28 GPa can be achieved in the case of aluminum oxide.

Furthermore, the coating compositions according to the invention are distinguished by high adhesion to the substrate. As a further advantage, the coating compositions according to the invention have a low diffusion coefficient for ions, and also a low permeability to water. By virtue of these properties, they are suitable, in particular, as protection of the substrate against corrosion or wear and abrasion.

Furthermore, the invention relates to the use of the coating composition according to the invention for coating substrates composed of e.g. metal, semiconductor, alloy, ceramic, quartz, glass or glass-like materials. This merely represents a choice of the possible substrates, and in no way a restriction. Generally, the coating composition according to the invention can be applied to (almost) all substrates. Suitable substrates are known to the person skilled in the art.

The diversity of the method according to the invention with regard to the conversion of the element/element oxide composite structure permits numerous applications. According to the invention, it is possible to produce very hard, wear-resistant protective layers for components exposed to a high degree of erosion and wear. The possibility of producing highly defect-free layers enables the protective layers to be used for electrical or thermal insulation. Furthermore, applications in the field of medicine, in particular as a coating for implants, are also possible. Surfaces structured in a targeted manner according to the invention are suitable for example in the field of catalysis, filtration or lithography through to storage media, such as information storage.

Furthermore, the element/element oxide composite structure according to the invention is suitable, owing to its absorption properties, for producing surfaces with absorption of a broad wavelength range. For example for light energy absorbing coatings for solar cells, light protective coatings, solar collectors and the like.

Furthermore, the invention comprises a device for carrying out the local heating preferably with the aid of a laser, preferably with a computer-controlled laser scanner, particularly preferably with an optical unit that focuses the laser beam.

A further advantageous development of the device according to the invention comprises the possibility of measuring the light absorption of the element/element oxide composite structure at the treatment location, during the heating or between a plurality of sintering processes. This can be done by measuring the intensity of the reflection of the laser at the heating location or by measuring the intensity of the reflection at the heating location using some other light source having a suitable wavelength during sintering or between a plurality of sintering processes. This permits complete automation of the method according to the invention.

Further details and features will become apparent from the following description of preferred exemplary embodiments in conjunction with the dependent claims. In this case, the respective features can be realized by themselves or as a plurality in combination with one another. The possibilities for solving the problem are not restricted to the exemplary embodiments. Thus, by way of example, range indications always encompass all—unmentioned—intermediate values and all conceivable sub-intervals.

XRD Analysis: X-ray Diffraction Analysis

DETAILED DESCRIPTION OF THE INVENTION

Figure 1:
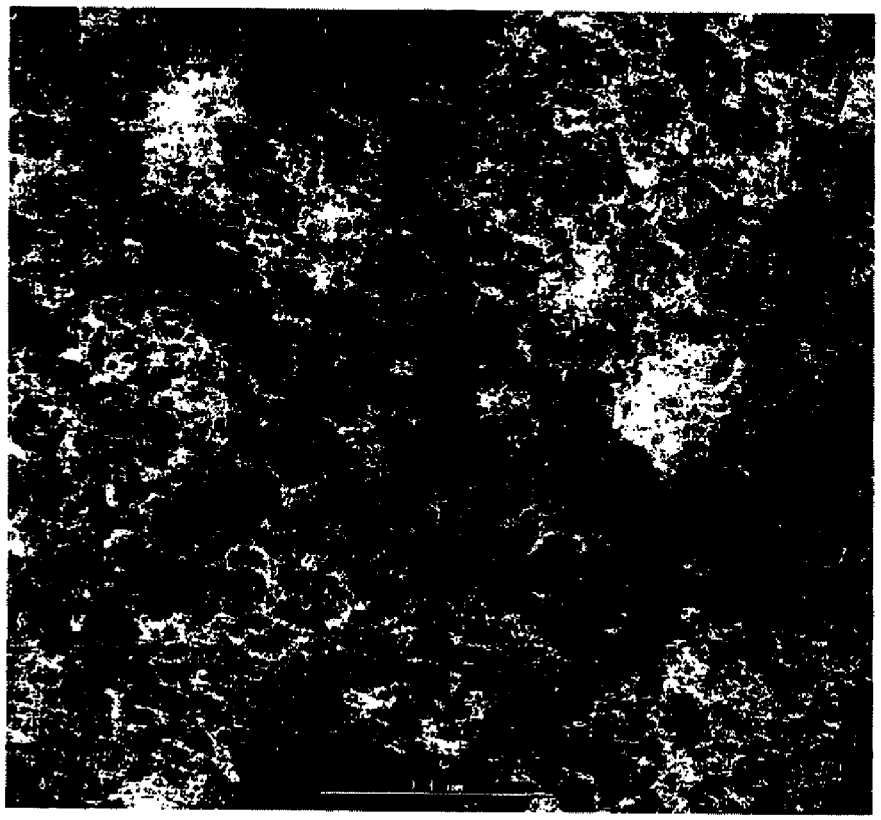
FIG. 1 photograph of an untreated Al/Al$_2$O$_3$ composite structure
Figure 2:
FIG. 2 photograph of a treated Al/Al$_2$O$_3$ composite structure (5 watt laser 5 mm/sec)
Figure 3:
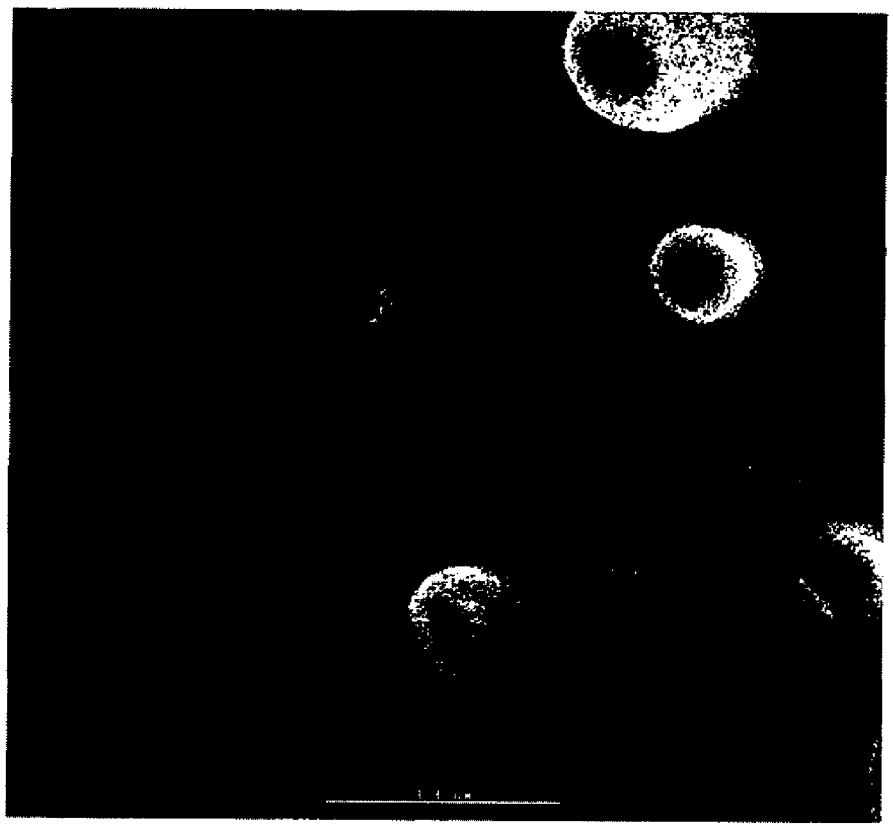
FIG. 3 photograph of a treated Al/Al$_2$O$_3$ composite structure (10 watt laser; 2 mm/sec)

The series of images in FIGS. 1 to 3 clearly shows the influence of the action of the laser depending on the duration of action, in this case given by the speed at which the laser was moved across the sample.

In detail, FIG. 1 shows an untreated Al/Al$_2$O$_3$ composite structure before the laser treatment. Neither a uniform surface nor a structuring of the surface can be discerned.

FIG. 2 shows an Al/Al$_2$O$_3$ composite structure after brief laser treatment. This gives rise to the formation of new morphologies and structures, in this case to nanowires and fractal structures.

FIG. 3 shows an Al/Al$_2$O$_3$ composite structure treated to complete conversion. Only a small number of defects can be discerned and the surface appears to be uniform.

Figure 4:
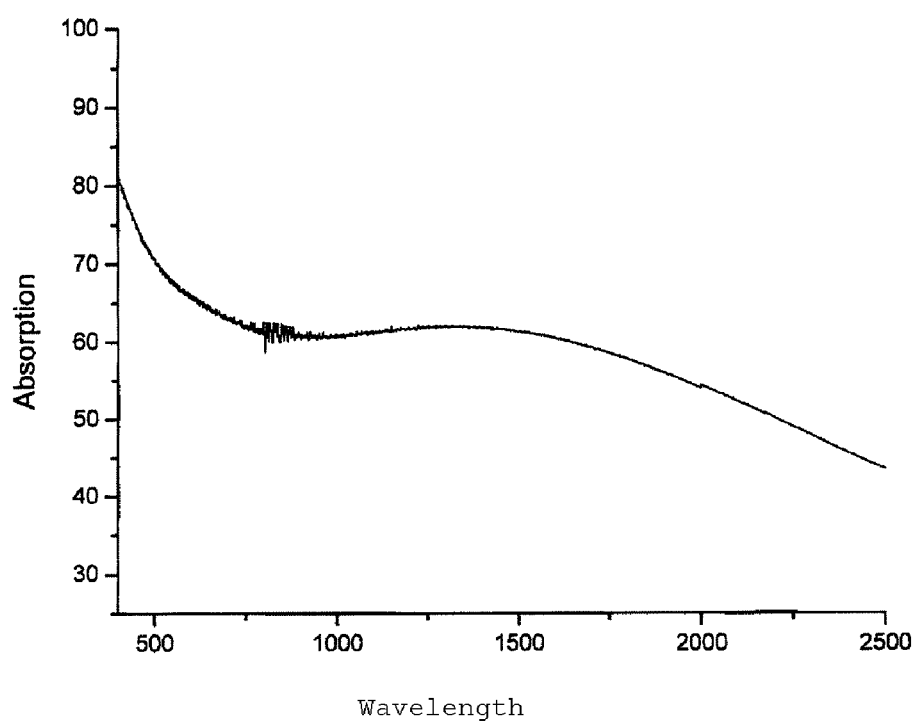
FIG. 4 absorption spectrum of an Al/Al$_2$O$_3$ composite structure (thickness: 200-400 nm)

FIG. 4 shows the broad absorption of the Al/Al$_2$O$_3$ composite structure (thickness: 200-400 nm). The absorption in a broad wavelength range permits the use of lasers in a broad wavelength range.

Figure 5:
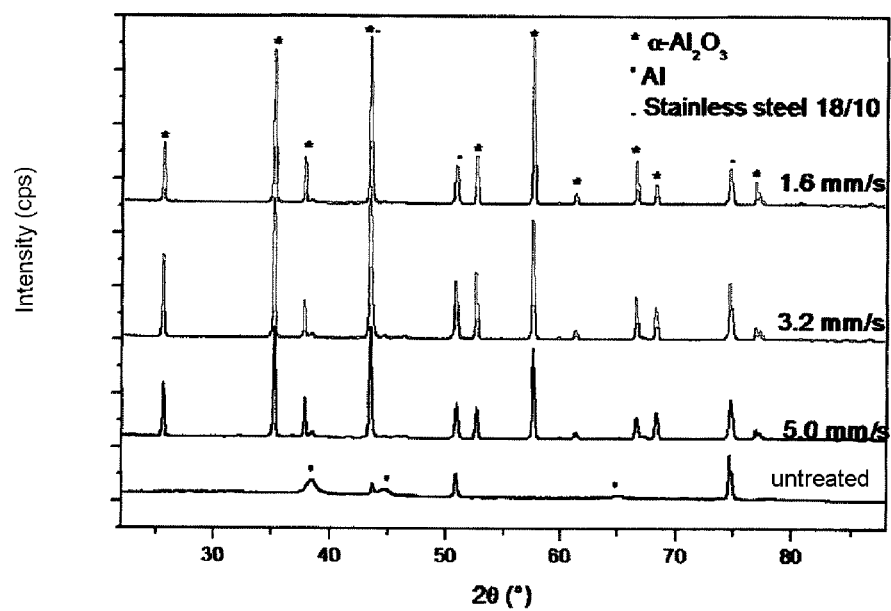
FIG. 5 X-ray diffraction analysis (XRD) of different Al/Al$_2$O$_3$ composite structures on stainless steel FIG. 6 X-ray diffraction analysis (XRD) of different Al/Al$_2$O$_3$ composite structures on titanium FIG. 7 photograph of an Al/Al$_2$O$_3$ composite structures treated partially and with increasing energy FIG. 8 examination of the water permeability of different Al/Al$_2$O$_3$ composite structures FIG. 9 measurement of the hardness of an $\alpha$-Al$_2$O$_3$ layer produced according to the invention.
Figure 6:
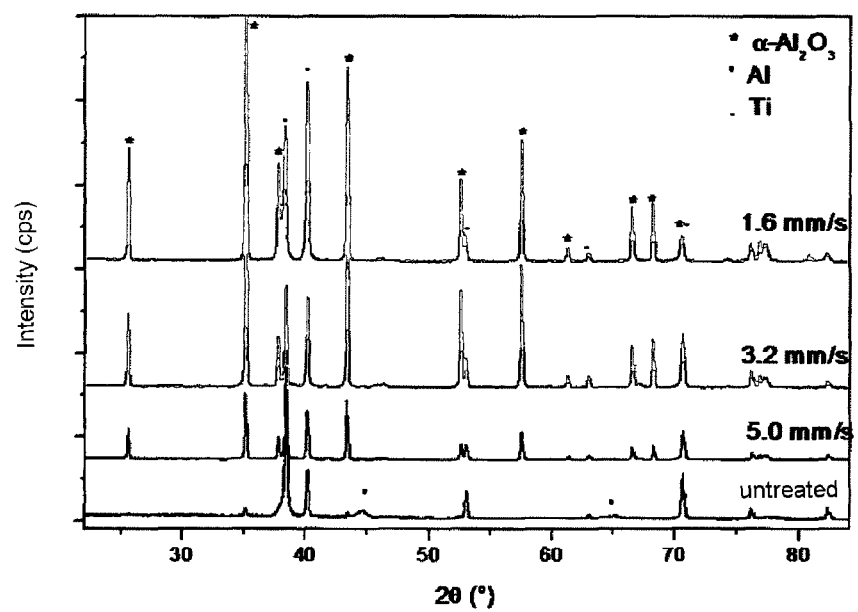

FIG. 5 and FIG. 6 show an X-ray diffraction analysis of different Al/Al$_2$O$_3$ composite structures which were treated for different periods of time on two different substrates. It is clearly possible to discern the arising and the increase of the signals of the $\alpha$-Al$_2$O$_3$ crystal structure, while the signals of the metallic aluminum decrease. This shows an increasing crystallization and formation of $\alpha$-Al$_2$O$_3$.

Figure 7:
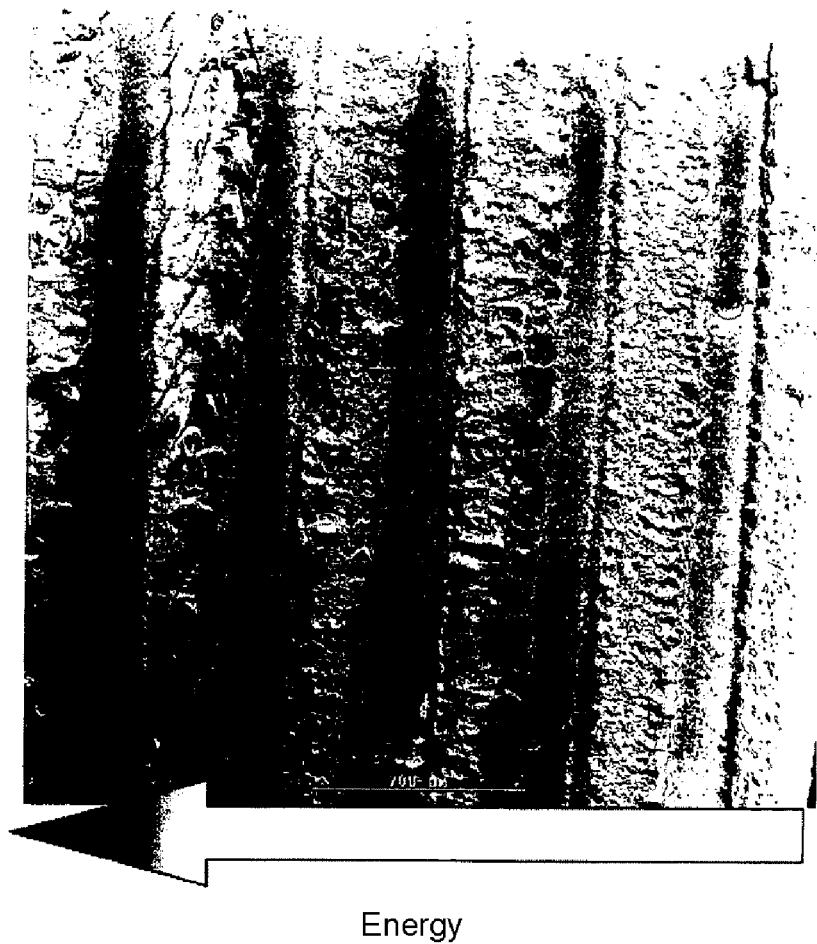

FIG. 7 shows the selective conversion in specific regions depending on the energy. On the Al/Al$_2$O$_3$ composite structure shown, strip-shaped regions were produced with the treatment intensity increasing toward the left, said regions being separated in each case by untreated strips, in accordance with the method according to the invention. It is clearly possible to discern the precise resolution and the accuracy with which the method according to the invention enables the targeted production of structures on surfaces.

Figure 8:
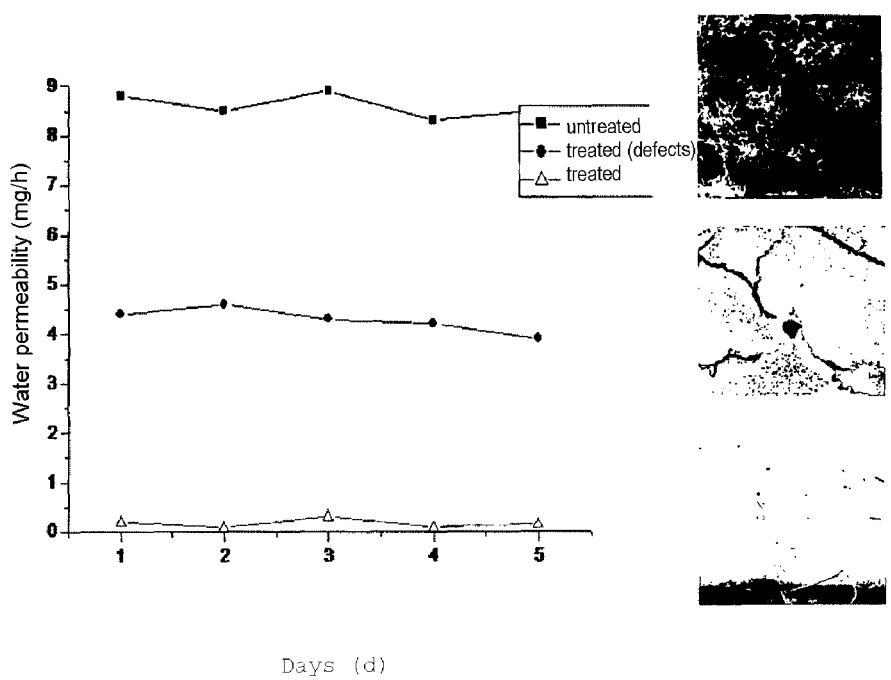

FIG. 8 shows the water permeability of differently treated Al/Al$_2$O$_3$ composite structures. While the untreated Al/Al$_2$O$_3$ composite structure (top, squares) exhibits a high permeability to water and is therefore not suitable as protection against corrosion, the completely converted Al/Al$_2$O$_3$ composite structure according to the invention exhibits no permeability (bottom, triangles). By contrast, an Al$_2$O$_3$ coating having defects (middle, circles) has a significantly higher permeability. This shows how important it is to precisely control the conversion conditions for the production of durable and secure protective layers.

Figure 9:
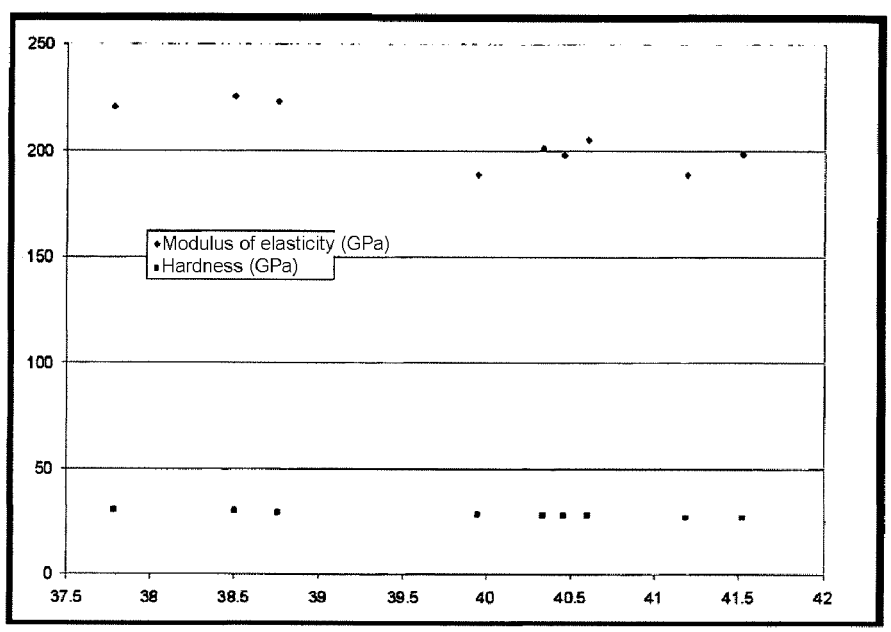

FIG. 9 shows the measurement of the hardness of a completely converted Al/Al$_2$O$_3$ composite structure with the aid of nano intendation. A hardness of 28 (+/−2) GPa was measured in this case.

EXEMPLARY EMBODIMENTS a) Production of the Element/Element Oxide Composite Structure The precursor aluminum tert-butoxydihydride (Al(tBu)H$_2$) was deposited onto a metallic substrate (steel, copper, nickel or platinum) or alternatively onto glass or ceramics in a CVD apparatus under argon at a temperature of 600° C. The furnace was heated inductively, wherein a conductive sample holder was used in the case of glass. The pressure in the reactor was approximately $6.0 \times 10^{-2}$ mbar. The volatile decomposition products of the precursor (including hydrogen and isobutene) were detected by a connected mass spectrometer. For an $Al/Al_2O_3$ composite structure having a layer thickness of approximately 1 µm, the duration of the inflow of precursor was approximately 10 minutes. Larger thicknesses were able to be obtained with a longer duration (30 to 90 minutes). The $Al/Al_2O_3$ composite structure obtained is dark to black in coloration owing to its absorption.

b) Local Heating

The local heating was carried out with the aid of a laser. Firstly, an air-cooled $CO_2$ laser having a wavelength of 10.6 µm was used, which laser was focused by means of a biconvex ZnSe lens having a focal length of 120 mm. The exposure diameter was 10-12 mm and the conversion width of the laser on the substrate was approximately 20-25 µm. The intensity of the laser was varied between 1 W/cm² and 5 W/cm². This laser is absorbed by the $Al/Al_2O_3$ composite structure and the aluminum oxide layer.

An argon ion laser having wavelengths in the range of visible light was furthermore used, which laser was focused with the aid of a biconvex lens having the focal length of 120 mm. The exposure diameter was 10-12 mm and the conversion width of the laser on the substrate was approximately 20-25 µm. The wavelengths of 514 nm, 488 nm, and also a wavelength range of 450 nm to 532 nm (mixed line) were used for the irradiation of the $Al/Al_2O_3$ composite structure. The intensity was varied between 0.4 W/cm² and 2 W/cm². This laser is absorbed only by the $Al/Al_2O_3$ composite structure and not by the aluminum oxide layer obtained upon complete conversion.

A pulsed laser was used in the case of fragile substrates, in particular in the case of some glasses and ceramics. In this case, it was possible to treat thin, and very thin layers of $Al/Al_2O_3$ composite structure without influencing the substrate. Lasers having the wavelengths of 266 nm, 355 nm, 532 nm or 1064 nm were used for this purpose. The intensity was kept low and was 200 joules for a pulse length of 4-8 ns. The exposure diameter was 10-12 mm and the conversion width of the laser on the substrate was approximately 20-25 µm. The treatment was carried out both with an individual pulse and with a repetition of pulses with a rate of 10 Hz. A small penetration depth of the laser of just 200-300 nm was able to be achieved as a result. This permitted the production of very thin oxide layers (<300 nm and even <200 nm) with particularly high protection against corrosion and having a hardness of 28 (+/−2) GPa.

LIST OF THE CITED LITERATURE

U.S. Pat. No. 6,521,203
U.S. Pat. No. 5,302,368
U.S. Pat. No. 5,654,035
U.S. Pat. No. 6,713,172
U.S. Pat. No. 5,683,761
U.S. Pat. No. 7,238,420
U.S. Pat. No. 6,048,954
U.S. Pat. No. 6,007,764
WO 2007/102143
DE 10 2006 013 484 A1
DE 19529241

Pradhan et al. "Crystallinity of $Al_2O_3$ films deposited by metalorganic chemical vapour deposition", Surface and Coating Technology, 176, (2004), 382-384

Triantafyllids et al. "Surface treatment of alumina-based ceramics using combined laser sources", Applied Surface Science, 186, (2002), 140-144

Zheng et al. "Effect of core-shell composite particles on the sintering behaviour and properties of nano-$Al_2O_3$/polystyrene composite prepared by SLS", Materials Letters, 60, (2006), 1219-1223

The invention claimed is:

1. A method for producing oxide compounds as a coating composition, comprising:
   a) thermolytic decomposition of at least one compound of the general formula $El(OR)_nH_2$, wherein El denotes Al, Ga, In or Tl, and R represents an aliphatic or alicyclic hydrocarbon radical, and n has the value 1 or 2; at a temperature of more than 450° C. at a pressure of between $10^{-4}$ mbar and $10^{-1}$ mbar on a surface with the formation of an element/element oxide composite structure comprising an element and the corresponding element oxide; and
   b) conversion of the element/element oxide composite structure into the substantially complete corresponding element oxide by local heating by a laser.

2. The method as claimed in claim 1, wherein El represents Al.

3. The method as claimed in claim 1 wherein the at least one compound comprises aluminum tert-butoxydihydride.

4. The method as claimed in claim 1, wherein the thermolytic decomposition is carried out at a temperature of between 450° C. and 650° C.

5. The method as claimed in claim 1, wherein the element/element oxide composite structure obtained in step a) is subjected to a treatment with a mixture, a solution and/or a suspension of organic and/or inorganic substances.

6. The method as claimed in claim 1, wherein the pure element of the element/element oxide composite structure serves as a binder, which melts during step b).

7. The method as claimed in claim 6, wherein the wavelength of the laser is in the range of 450 nm to 532 nm.

8. The method as claimed in claim 1, wherein the element/element oxide composite structure is not completely converted into the corresponding element oxide at the heating location in step b).

9. The method as claimed in claim 1, wherein the element/element oxide composite structure is completely converted into the corresponding element oxide at the heating location in step b).

10. The method as claimed in claim 9, wherein the conversion produces a uniform element oxide layer having a thickness of 10 nm to 400 nm.

11. The method as claimed in claim 1, wherein the conversion of the element/element oxide composite structure is by a pulsed laser.

12. The method as claimed in claim 1, wherein the element/element oxide composite structure in step a) comprises a nanowire.

13. The method as claimed in claim 1, wherein El denotes Al and the substantially complete corresponding element oxide is $\alpha$-$Al_2O_3$.

14. The method as claimed in claim 1, wherein the coating composition comprises at least 95% of the element oxide.

* * * * *